(12) United States Patent
Toner

(10) Patent No.: US 6,859,028 B2
(45) Date of Patent: Feb. 22, 2005

(54) DESIGN-FOR-TEST MODES FOR A PHASE LOCKED LOOP

(75) Inventor: Michael F. Toner, Nepean (CA)

(73) Assignee: Sige Semiconductor Inc., Ottawa (CA)

( * ) Notice: Subject to any disclaimer, the term of this patent is extended or adjusted under 35 U.S.C. 154(b) by 144 days.

(21) Appl. No.: 10/303,964

(22) Filed: Nov. 26, 2002

(65) Prior Publication Data

US 2004/0100294 A1 May 27, 2004

(51) Int. Cl.[7] ............................................. G01R 23/12
(52) U.S. Cl. ..................... 324/76.53; 327/156; 327/157; 331/25
(58) Field of Search ........................... 324/76.53, 76.39, 324/76.52, 601, 603–606; 331/25, 16, 74; 327/157, 156; 713/500–503

(56) References Cited

U.S. PATENT DOCUMENTS 5,903,748 A * 5/1999 McCollough et al. ....... 713/503
5,933,058 A * 8/1999 Pinto et al. .................... 331/17
5,991,888 A * 11/1999 Faulkner et al. ............ 713/501

* cited by examiner

*Primary Examiner*—Vincent Q. Nguyen

(57) ABSTRACT

There is a desire to provide a testing method and apparatus that can be successfully integrated into a PLL and PLL-like circuits (e.g. frequency synthesizers, delay lock loops, etc.). It is desirable that the PLL or PLL-like circuit integrated with testing apparatus does not suffer from performance degradations during nominal (mission mode) operation. Furthermore, it is desirable that the PLL and the testing apparatus share the same interface. In order to produce a PLL having integrated testing apparatus, without having the PLL suffer severe performance degradations during nominal operation nor having the combination of the PLL and testing apparatus be unnecessarily large, a modified PLL integrated with testing apparatus is provided.

16 Claims, 3 Drawing Sheets

DESIGN-FOR-TEST MODES FOR A PHASE LOCKED LOOP

FIELD OF THE INVENTION

The present invention relates to the testing of integrated circuits and in particular to the testing of fully integrated phase locked loops.

BACKGROUND

Generally, the testing of integrated circuits presents a number of technical challenges that significantly add to the cost of development and production. Specifically, there are two major difficulties that arise in the testing of integrated circuits. The first is accessibility to the individual components integrated onto the chip. The second is to provide complete test coverage while minimizing the added test structures on the chip required for testing all of the integrated product components.

Test structures take up additional space (i.e. chip area) that reduces the usable area of a chip or add to the overall chip area required for the end product. Test structures also cause undesirable parasitic loading of the integrated circuit components leading to performance degradation and spurious power consumption. Furthermore, the interface used to access the test structures is typically different from the actual integrated product interface; thus, once an integrated product is in the field it becomes difficult to identify and resolve even minor problems. Lastly, in many cases the interface to the test structures also requires that the chip (die) have more I/O (input/output) pads than would be required for only the actual integrated product, which in turn leads to a significant increase in the cost of packaging the chip.

One approach to overcome these challenges is to undertake the integrated circuit design with testability in mind from the start. So-called "design for testability" is a design practice that incorporates the required logic and testing modes for a particular integrated circuit into the integrated circuit design. However, there are many integrated circuits into which it is difficult and problematic to incorporate the required test structures into the design. In these cases there are typically severe performance degradations induced in the final product that result from the combination of the integrated circuit and the test structures.

A phase locked loop (PLL) is an example of an integrated circuit that suffers from the aforementioned performance degradations (as do synthesisers, delay lock loops and other circuits derived from the basic PLL topology). It is well understood that adding additional circuit elements within the loop typically has a negative impact on the cost and performance of the PLL (and other circuits derived from it). Therefore, test structures that do not add to the function of the loop have been considered a problem and have thus been avoided. This has lead to severe limitations on ability to test the individual components that make up a fully integrated PLL (or PLL-like) circuit. In many instances only the overall performance of PLL (or PLL-like) circuits could be tested, leaving the actual performance characteristics of the components to be ignored or inferred from the over-all performance of the PLL.

There is a desire to provide a testing method and apparatus that can be successfully integrated into a PLL that enables the isolation (for the purposes of testing and observation) of specific nodes and components of the PLL that are not easily accessible during normal operation. It is desirable that the testing method and apparatus can be added to a PLL without negatively impacting the performance or cost of the PLL. Specifically, it is desirable that the PLL integrated with the testing apparatus does not suffer from performance degradations during nominal (mission mode) operation. Furthermore, it is desirable that the PLL and the testing apparatus share the same interface so that additional input/output (I/O) pads are not required.

SUMMARY OF THE INVENTION

According to the invention there is provided a modified phase locked-loop (PLL) integrated with testing apparatus. The PLL in combination wit the integrated testing apparatus is designed such that the PLL does not suffer severe performance degradations during nominal operation nor is the combination of the PLL and testing apparatus unnecessarily large.

Specifically, according to a preferred embodiment of the invention a Phase-Locked Loop (PLL) integrated with testing apparatus comprises in a loop: i) a Phase-Frequency Detector (PFD), the PFD having first and second signal inputs, a test control input and an output, wherein the test control input is used to switch the PFD between a normal operating mode, in which the output delivers an output signal containing the phase and frequency difference between first and second signals applied respectively to the first and second signal inputs, and a transparent mode, in which only one of the first and second signal inputs is coupled to the output such that the corresponding signal is coupled through to the output unaltered; ii) a Voltage Controlled Oscillator (VCO), the VCO having an input and an output, the input of the VCO connected to the output of the PFD; iii) a frequency divider, the frequency divider having an input and an output, the input of the frequency divider connected to the output of the VCO; and iv) a first multiplexer (MUX), the first MUX having first and second signal inputs, a control input and an output, the output of the first MUX connected to the second signal input of the PFD, the first signal input of the first MUX connected to the output of the frequency divider, the second signal input coupled to receive a bias signal, and the control input coupled to receive a control signal; wherein the control signal coupled to the control input of the first MUX is set to select which one of the first and second signal inputs is coupled to the output of the first MUX.

In some embodiments the PLL may further comprise a charge pump, the charge pump having an input and an output, the charge pump connected between the PFD and the VCO.

Additionally, in some embodiments the PLL may further comprise a loop filter connected to the input of the VCO. Alternatively, the PLL may further comprise a loop filter connected between the PFD and the VCO.

In further modified embodiments the PLL may further comprise a second MUX between VCO and the frequency divider, the second MUX having first and second signal inputs, a control input and an output, the output of the second MUX connected to the input of the frequency divider, the first signal input of the second MUX connected to the output of the VCO, the second signal input of the second MUX coupled to receive a first test signal, and the control input of the second MUX coupled to receive a second control signal, wherein the second control signal coupled to the control input of the second MUX is set to select which one of the first and second signal inputs is coupled to the output of the second MUX.

Yet in other embodiments the PLL may further comprise a third MUX having first and second signal inputs, a control input and an output, the output of the third MUX connected to the first input of the PFD, the first signal input of the third MUX coupled to receive a reference signal, the second signal input of the third MUX coupled to receive a second bias signal, and the control input of the third MUX coupled to receive a third control signal, wherein the third control signal coupled to the control input of the third MUX is set to select which one of the first and second signal inputs is coupled to the output of the third MUX.

Additionally, the PLL may further comprise a reference divider circuit, the reference divider having an input and an output, the input coupled to receive the reference signal and the output connected to the first signal input of the third MUX to provide a signal to the third MUX derived from the reference signal.

Moreover, the PLL may further comprise a mixer connected between the VCO and the second MUX, the mixer having two inputs and an output, the output of the mixer connected to the first signal input of the second MUX, the first input of the mixer coupled to receive the output of the VCO and the second input of the mixer coupled to receive a local reference signal. And advantageously, the PLL may further comprise a local oscillator, the local oscillator providing the local reference signal.

In yet an further modification the PLL may further comprise a fourth MUX between the local oscillator and the second input of the mixer, the fourth MUX having first and second signal input, a control input and an output, the first signal input of the fourth MUX coupled to receive the local reference signal, the second signal input of the fourth MUX coupled to receive a fourth bias signal, the output of the fourth MUX connected to the second input of the mixer, and the control input of the fourth MUX coupled to receive a fourth control signal, the fourth control signal set to select which of the two signal inputs is coupled to the output of the fourth MUX.

Other aspects, features and arrangements of the present invention will be apparent to those of ordinary skill in the art upon review of the following description of specific embodiments of the invention in conjunction with the accompanying figures.

BRIEF DESCRIPTION OF THE DRAWINGS

The invention will now be described in greater detail with reference to the accompanying diagrams, in which.

DETAILED DESCRIPTION OF THE PREFERRED EMBODIMENTS

In order to produce a phase locked-loop (PLL) having integrated testing apparatus, without having the PLL suffer severe performance degradations during nominal operation nor having the combination of the PLL and testing apparatus be unnecessarily large, a modified PLL integrated with testing apparatus is provided. To that end, FIG. 2 illustrates a first embodiment of a PLL 10' integrated onto a chip adapted according to the invention from a typical PLL 10 (also integrated on a chip) shown in FIG. 1.

Figure 1:
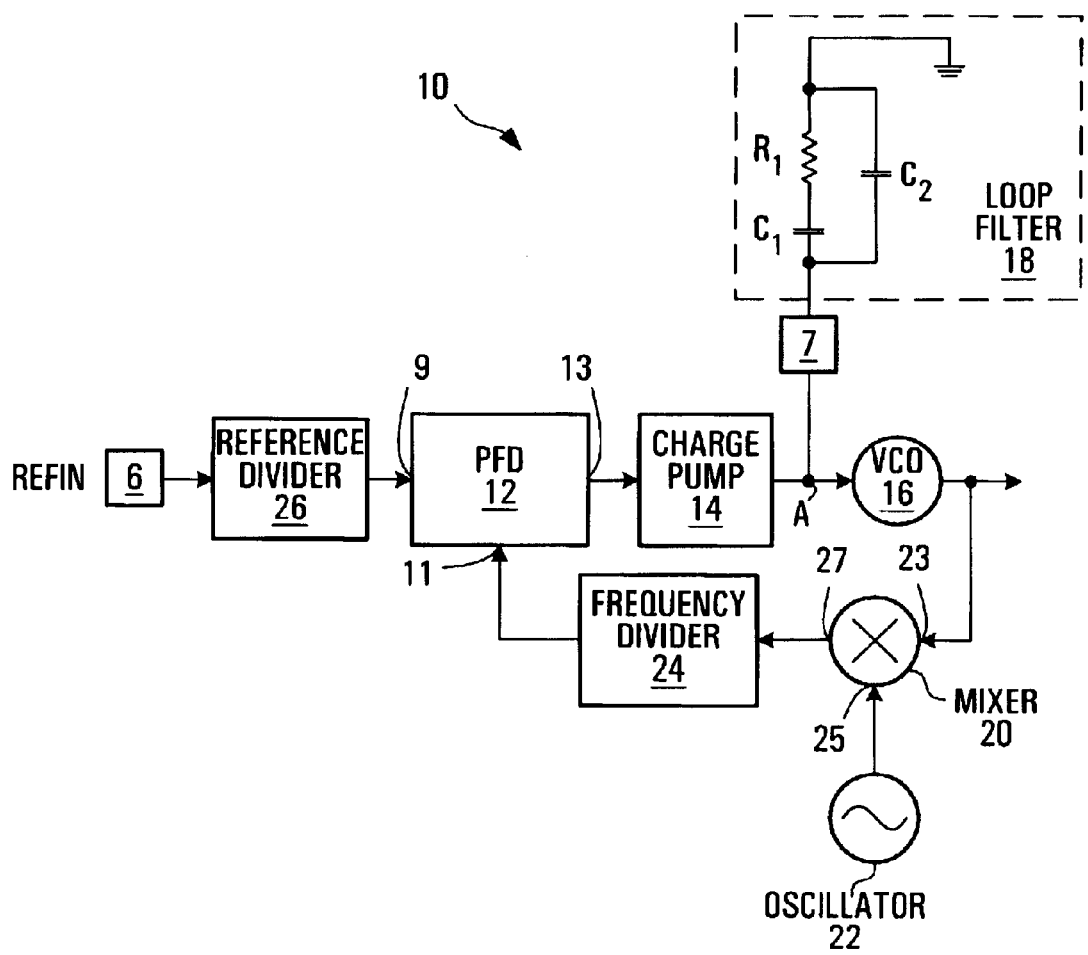
FIG. 1 is a schematic of a typical phase locked loop (PLL)
Figure 2:
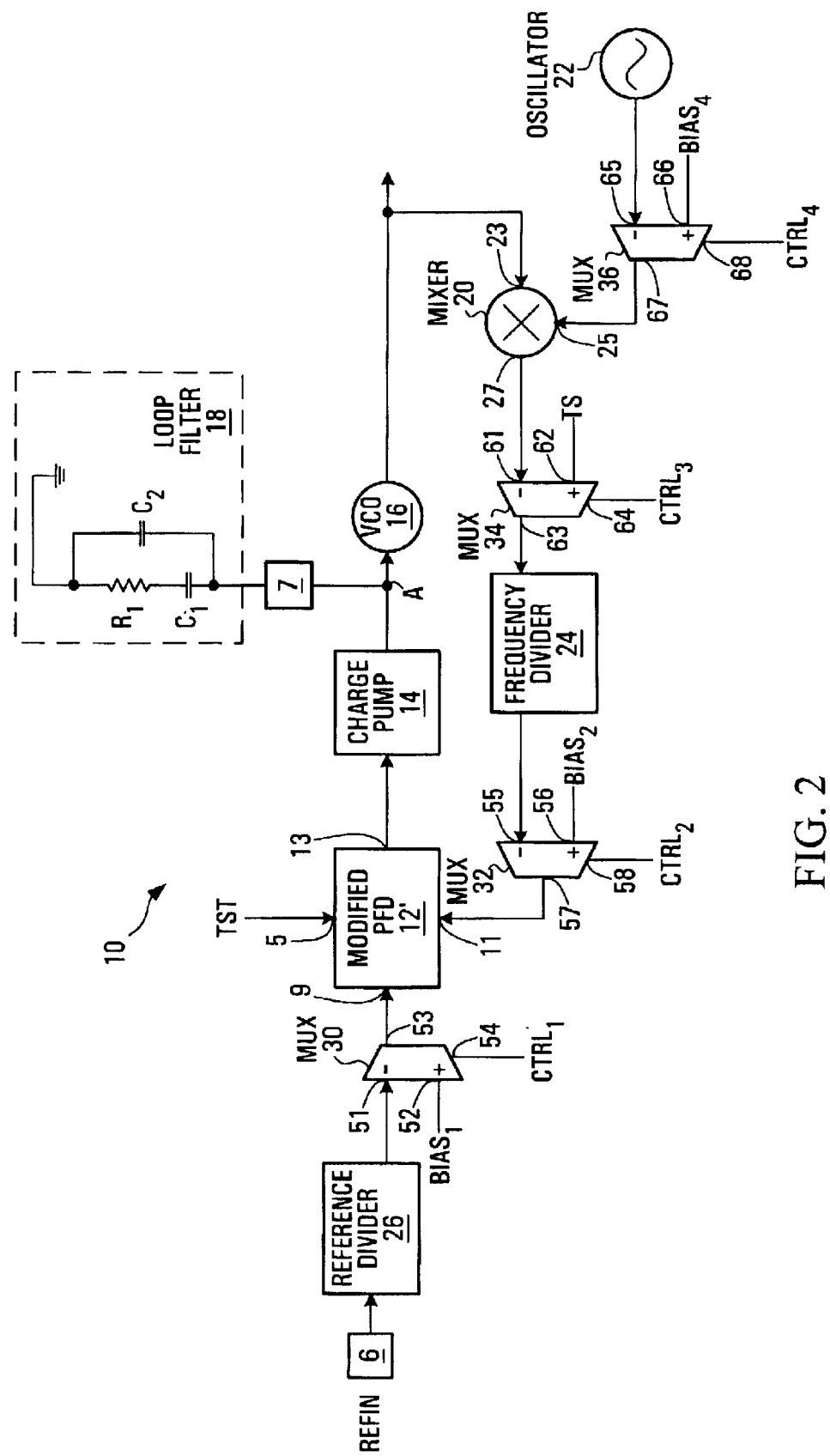
FIG. 2 is a block diagram of a PLL according to an embodiment of the invention.

The PLL 10 of FIG. 1 has a first number of circuits connected to form a loop. The circuits forming the loop (listed in order) are a phase-frequency detector (PFD) 12, a charge pump 14, a loop filter 18, a voltage-controlled oscillator (VCO) 16, a mixer 20, and a frequency divider 24, the frequency divider 24 connected to the PFD 12 to close the loop. The PLL 10 also has a reference divider 26 coupled to the PFD 12 and an oscillator 22 coupled to the mixer 20. The reference divider 26 and the oscillator 22 are not within the loop of the PLL 10, however they are required for the nominal operation of the PLL 10. All of the circuits and various connections amongst them are detailed below.

It would be understood that a basic embodiment of a PLL may only comprise the PFD 12, the loop filter 18 and the VCO 16 connected to form a respective loop. A PLL may even be designed without the loop filter 18 with the features of the loop filter 18 integrated into the VCO 16 or PFD 12, and possibly neglecting the features provided by the loop filter altogether. However, such instances of simple PLLs are rarely of practical use; thus, the discussion will focus on the topology of the PLL 10 and modifications to it. It is assumed that all the circuits of the PLL 10 are all integrated onto a single die (i.e. chip) and it should be understood that FIG. 1 illustrates only the features of the PLL 10 required to discuss the invention. It would also be understood that one skilled in the art would be aware of an additional combination of hardware, software and firmware used to support the normal operation of the PLL 10.

Specifically, the PFD 12 has first and second inputs 9 and 11 and an output 13. The first input 9 is connected to receive a first signal from the reference divider 26, the reference divider 26 is directly coupled to an I/O pad 6 through which a reference signal REFIN is coupled onto the chip. The I/O pad 6 serves as an external connection to the PLL 10. The second input 11 of the PFD 12 is coupled to receive a second signal from the frequency divider 24. The output 13 of the PFD 12 is coupled into the charge pump 14.

The charge pump 14 is connected to a node A to which the loop filter 18 and VCO 16 are also coupled. In some embodiments of the PLL 10 a different loop filter could be used to replace the loop filter 18, such that the different loop filter is placed in series between the charge pump 14 and the VCO 16. As a result only the loop filter and the charge pump 14 are connected to node A. Node A (in the present embodiment and others) may also serve as another external connection point to the PLL 10 to which a second I/O pad 7 is connected. The output of the VCO 16 is coupled into the mixer 20 through a first input 23. The mixer 20 has a second input 25 into which the output of the oscillator 22 is coupled. A single output 27 of the mixer 20 is then coupled into the frequency divider 24, and as previously noted the output of the frequency divider 24 is connected to the second input 11 of the PFD to close the loop of the PLL 10. It would be understood by those skilled in the art that the mixer 20 and the frequency divider 24 are provided as additional features to the PLL 10 and that the mixer 20 and the frequency divider 24 are not an essential features for all embodiments of the invention.

The operation of the PLL 10 is as follows. The PFD 12 compares the first and second signals received into its two inputs 9 and 11, respectively, to deliver from its output 13 an output signal that contains the phase and frequency difference between the two input signals. The first signal is a signal derived from the reference signal REFIN that is initially input to the reference divider 26, whereas the second signal is (in steady state) an estimate of the first signal.

The output signal of the PFD 12 is then used to drive the charge pump 14. The charge pump converts the output signal received from the PFD 12 to a current signal containing numerous frequency components. The loop filter 18 acts to filter away the high frequency components of the current signal. This produces on node A a low frequency (more-or-less DC) voltage of an average DC level corresponding to the relative phase and frequency difference of the first and second signals input into the PFD 12 through inputs 9 and 11 respectively. The voltage on node A serves to set the frequency of the output signal of the VCO 16.

The loop filter 18, according to FIG. 1, is comprised of a capacitor C2 coupled in parallel across the series connection of a resistor R1 and a capacitor C1. However, it would be understood by those skilled in the art that any lowpass filter suitable for the requirements of the PLL 10 can be used as a loop filter.

The output signal of the VCO 16 is then combined within the mixer 20, which is preferably a single sideband (SSB) mixer, with the output of the oscillator 22 to produce a mixer output signal that has one distinct frequency component that is $-\Delta f$ away from the fundamental frequency component of the output of the VCO 16. The one distinct frequency component is used by the frequency divider 24 to produce an updated version of the second input signal coupled to input 11 of the PFD 12. Recall that this second input signal is meant to be an estimate of the first input signal coupled into the input 9 of PFD 12. The purpose of the PLL 10 is to acquire and track the first input signal with the locally generated second input signal. In other words the PLL 10 is designed to operate such that the output of the frequency divider 24 is adjusted to track the phase and frequency of a reference signal delivered to the input 9 of the PFD 12 within a reasonable phase offset and frequency range.

The problem with testing a circuit like the PLL 10 is that gaining access to the individual components without disturbing the operation of the loop or adding additional I/O pads to gain access is very difficult. Thus, designers of such fully integrated circuits have been limited to only testing the overall performance of the PLL 10 and have not been able to test each of the PLL 10 components.

Shown in FIG. 2 is a PLL 10' that has been adapted from the PLL 10 (shown in FIG. 1) to include integrated testing apparatus that enables the isolation and testing of the individual components. The PLL 10 has been modified to provide the PLL 10' as follows. A total of four multiplexers (MUX's) 30, 32, 34, 36 are placed within the loop of the PLL 10 and the PFD 12 is replaced with a modified PFD 12'.

The modified PFD 12' has signal inputs 9,11 and an output 13 corresponding to those of PFD 12. The modified PFD 12' also has a third test-signal input 5 into which a test signal TST is coupled. The test signal TST is used to enable testing modes of the PLL 10' in which the PFD 12' must be by-passed.

The first MUX 30 having two signal inputs 51, 52 and an output 53 is placed between the reference divider 26 and the modified PFD 12'. The output of the reference divider 26 is coupled into the first signal input 51 of the MUX 30 and a bias signal $BIAS_1$ is coupled to the second signal input 52. A control signal $CTRL_1$ is coupled to a control terminal 54 of the MUX 30. The control signal $CTRL_1$ is a binary signal used to select which one of the two signal inputs 51,52 is coupled to the output 53 that is in turn coupled to the input 9 of the modified PFD 12'.

The second MUX 32 having two signal inputs 55, 56 and an output 57 is placed between the frequency divider 24 and the modified PFD 12'. The output of the frequency divider 24 is coupled to the first signal input 55 of the MUX 32 and a second bias signal $BIAS_2$ is coupled to the second signal input 56. A control signal $CTRL_2$ is coupled to a control terminal 58 of the MUX 32. The control signal $CTRL_2$ is a binary signal used to select which one of the two signal inputs 55,56 is coupled to the output 57 that is in turn coupled to the input 11 of the modified PFD 12'.

In the example PLL 10' shown in FIG. 2 the bias signals $BIAS_1$ and $BIAS_2$ are required to ensure that the modified PFD 12' is in an intelligent state during various test modes that require the loop to be broken. Specifically, during the test modes it may be required that only one of the two signal inputs coupled to the modified PFD 12' be used. This easily enables the various components of the PLL 10 to be isolated. However, in other embodiments the PLL 10' may have the PFD 12' modified to maintain an intelligent state without the bias signals $BIAS_1$ and $BIAS_2$, which could in some embodiments by-pass the use of the MUX 30 and the MUX 32.

The third MUX 34 having two signal inputs 61, 62 and an output 63 is placed between the frequency divider 24 and the mixer 20. The output 27 of the mixer 20 is coupled to the first signal input 61 of the MUX 34 and a test signal TS is coupled to the second signal input 62. A control signal $CTRL_3$ is coupled to a control terminal 64 of the MUX 34. The control signal $CTRL_3$ is a binary signal used to select which one of the two signal inputs 61,62 is coupled to the output 63 that is in turn coupled to the input of the frequency divider 24.

The test signal TS has a somewhat different function to that of the bias signal $BIAS_1$ and $BIAS_2$. The test signal TS is used to provide a controlled signal source that is useful for testing the frequency divider 24 and the VCO 16. On the other hand, the bias signals $BIAS_1$ and $BIAS_2$ ensure that the modified PFD 12' is within an intelligent state as it is forced into a transparent mode by setting the test signal TST. In other words, the bias signal $BIAS_1$, $BIAS_2$ do not function as test signals that can be adjusted to measure performance of any of the components of the PLL 10'. The bias signals $BIAS_1$, $BIAS_2$ do ensure that the PFD 12' delivers a valid output during the testing modes in which other signals are varied for the purpose of performance measurements.

The fourth MUX 36 having two signal inputs 65,66 and an output 67 is placed between the mixer 20 and the oscillator 22. The output of the oscillator 22 is coupled to the first signal input 65 of the MUX 36 and a bias signal $BIAS_4$ is coupled to the second signal input 66. A control signal $CTRL_4$ is coupled to a control terminal 68 of the MUX 36. The control signal $CTRL_4$ is a binary signal used to select which one of the two signal inputs 65,66 is coupled to the output 67 that is in turn coupled to the input 25 of the mixer 20.

During the nominal (mission mode) operation of the PLL 10' the MUX's 30, 32, 34 and 36 are set such that the loop is fully connected. This means that the in the PLL 10' the control signals $CTRL_1$, $CTRL_2$, $CTRL_3$ and $CTRL_4$ are all at a low logic state. Thus, each of the corresponding MUX's 30, 32, 34 and 36 will not couple the respective bias and test signals through to the input of the circuits following them. In this way the PLL 10' will operate identically to the PLL 10 shown in FIG. 1.

It is important to stress that the MUX's 30, 32, 34 and 36 have been designed according to the invention such that their insertion into the loop will not adversely effect the performance of the PLL 10' in relation to the performance characteristics of the PLL 10. Specifically, the MUX's 30, 32, 34 and 36 must be optimized to minimize the amount of phase noise that they add to the signals passed through them. Consequently, their design will follow from the same design techniques known in the art used to optimize the frequency divider 24 so that their phase noise contributions are minimized.

An advantage of having the MUX's 30, 32, 34 and 36 in the loop of the PLL 10' is that they can be used during the development, production and field testing to test the individual components of the PLL 10'.

In operation, a first test mode of the PLL 10' is that which isolates and enables the testing of the frequency divider 24. The first test mode requires that the test signal TST be set to indicate that the modified PFD 12' go into and maintain a transparent mode until the test signal TST changes. In the transparent mode of operation only one signal input 9,11 is coupled unaltered to the output 13 of the modified PFD 12'.

In the first test mode it is the operation of the frequency divider 24 which is to be tested. Thus, it is the output of the frequency divider 24 that must be isolated and coupled through to the signal input 11 of the modified PFD 12' while ignoring the output of the reference divider 26. This is done by setting the control signal $CTRL_1$ for MUX 30 to the state indicating that the bias signal $BIAS_1$ is to be coupled to the signal input 9 of the modified PFD 12' and not the output of the reference divider 26. The bias signal $BIAS_1$ is meant to keep the signal input 9 from floating, thus ensuring that the modified PFD 12' is within an intelligent state. The output of the frequency divider 24 is coupled through the MUX 32 to the signal input 11. This is done by setting the control signal $CTRL_2$ for MUX 32 to the state indicating that the output of the frequency divider 24 is to be coupled through to the modified PFD 12' and not the bias signal $BIAS_2$. The final step of this procedure is to set the control signal $CTRL_3$ for MUX 34 to a state indicating that the test signal TS is to be coupled to the input of the frequency divider 24 and not the output 27 of the mixer 20.

Once the first test mode has been set up as described above, the test signal TS, that is applied to the input of the frequency divider 24, can be changed in order to observe the response of the frequency divider 24 over a range of operating conditions. The output of the frequency divider 24, which would normally trigger the modified PFD 12', now directly causes the charge pump 14 to source or sink current depending on the state it is forced into by the output of the frequency divider 24. The response of the frequency divider 24 is observed by measuring the current at the output of the charge pump 14 via I/O pad 7. The effect on the VCO 16 and the loop filter 18 is of no consequence in the first test mode as their effect on the frequency divider 24 output has been cut off by the MUX 34.

The transparent mode of operation for the modified PFD 12' is not unique to this first test mode and it will be used in other test modes. The details of the second and third test modes are given below.

In a second test mode it is the operation of the reference divider 26 which is to be tested. Thus, it is the output of the reference divider 26 that must be isolated and coupled through to the modified PFD 12' while ignoring the output of the frequency divider 24. This is done by setting the control signal $CTRL_2$ for MUX 32 to the state indicating that the bias signal $BIAS_2$ is to be coupled to the signal input 11. Similar to the bias signal $BIAS_1$, the bias signal $BIAS_2$ is meant to keep the signal input 11 from floating, thus ensuring that the modified PFD 12' is within an intelligent state. The output of the reference divider 26 is coupled through the MUX 30 to the signal input 9 of the modified PFD 12'. This is done by setting the control signal $CTRL_1$ for MUX 30 to the state indicating that the output of the reference divider 26 is to be coupled through to the modified PFD 12' and not the bias signal $BIAS_1$.

Once the second test mode has been set up as described above the reference signal REFIN, coupled through I/O pad 6 and the reference divider 26, can be varied in order to observe the response of the reference divider 26 over a range of operating conditions. The output of the reference divider 26, which would normally trigger the modified PFD 12', now directly causes the charge pump 14 to source or sink current depending on the state it is forced into by the output of the reference divider 26. The response of the reference divider 26 is observed by measuring the current at the output of the charge pump 14 at I/O pad 7. The other components of the PLL 10' will not effect these measurements as the loop has been broken by way of MUX 32.

A third test mode enables the testing of the VCO 16 and the charge pump 14. Referring again to FIG. 2, the third test mode is set up as follows. The test signal TST is set to switch the modified PFD 12' into the transparent mode. The outputs of the oscillator 22 and reference divider 26 are cut-off from the PLL 10' by MUXs 36 and 30 respectively. The output of the oscillator is replaced by a bias signal $BIAS_4$. The bias signal $BIAS_4$ is similar to the bias signals $BIAS_1$ and $BIAS_2$ in that it is used to ensure a valid output signal delivered by the mixer 20 from the output 27. The output of the reference divider is replaced with the bias signal $BIAS_1$ as is done in the first test mode.

The MUXs 32 and 34 are set via control signals $CTRL_2$ and $CTRL_3$, respectively, to connect the modified PFD 12', charge pump 14, the VCO 16, mixer 20 and frequency divider 24 in a loop as per the mission-mode operation of the PLL 10'. Further to this an external voltage source (not shown) is connected to I/O pad 7 to force the DC voltage level at node A to desired test levels. At the various test levels the external voltage source is able to measure the amount of current being drawn from or to itself through the charge pump 14. It should be noted that the external voltage source being described is a common item found in an electronics lab and that this third test mode would not require any modifications or special calibration of such an item. Such an external voltage source may preferably have an integrated multi-meter built into to provide the measurement features.

Specifically, in operation of this third test mode MUX's 30 and 32 are used, as described for other test modes, to gain access to the inputs 9 and 11 of the PFD 26. Signals are applied to inputs 9 and 11 that are independently clocked from one another, so that one is stationary while the other is changing. This allows the measurement of the charge pump current in its steady state while enabling the drive voltage applied to node A via I/O pad 7 to be swept across a predetermined range to test the VCO 16. Note that because the PFD 12' is again placed in transparent mode, the duration of the output pulse of the frequency divider 24 is lengthened from its mission mode duration (typically only a few nanoseconds) to value that is easier to measure. This method can verify that the VCO 16 will operate over its required range of frequencies, and the gain $K_{VCO}$ of the VCO can be directly measured because the control voltage is known and the output frequency can be measured.

A fourth test mode enables the testing of the oscillator 22, and is particularly useful when the the oscillator 22 is integrated on the same chip as the PLL 10'. Again an external voltage source is coupled to I/O pad 7 to force the control voltage of the VCO 16 through a continuous range of values to test the deliverable output range. However, unlike the third test mode the charge pump 14 current is measured while the oscillator 22 output is coupled through MUX 36 to the input 25 of the mixer 20.

However, the oscillator 22 may be a component of another PLL. That is, its output may be the output of another PLL. As a result, one skilled in the art would recognize that the fourth test mode is an optional procedure as the oscillator 22 would be tested through the testing apparatus of the other PLL.

Figure 3:
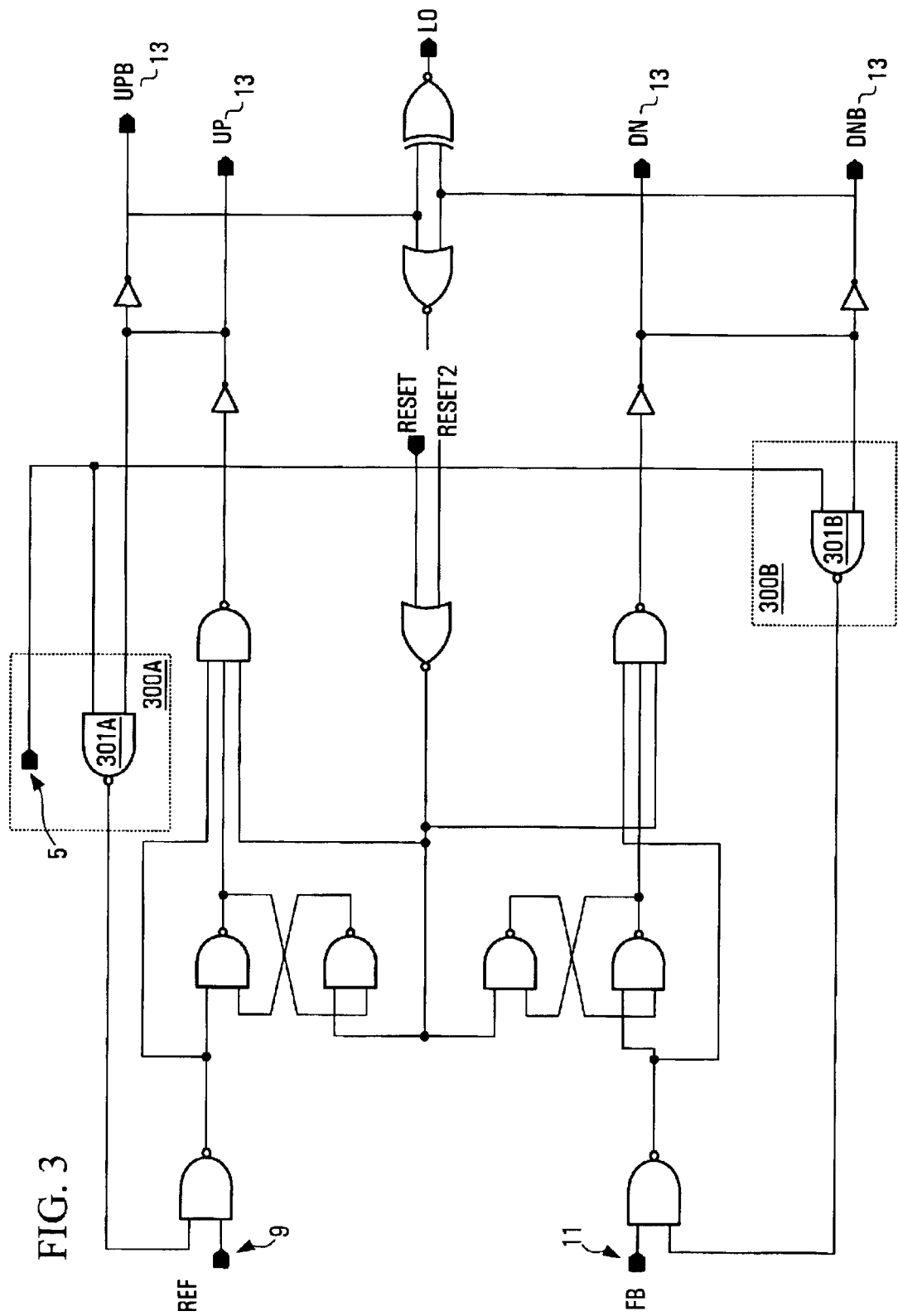
FIG. 3 is a block diagram of a modified phase-frequency detector used in the modified PLL of FIG. 2.

FIG. 3 shows a schematic of the modified PDF 12' used in the PLL 10' of FIG. 2. Highlighted by dashed boxes 300a and 300b are two additional NAND gates 301a and 301b respectively. As previously described the test signal TST is coupled to the third signal input 5 which is connected to the two NAND gates 301a and 301b. When appropriately set the TST signal operates to maintain a bias value on the input (9 or 11) that does not receive a valid input so that the modified PFD 12' can pass through the other input received to the output 13. Generally indicated in FIG. 3, are four outputs 13 that can be used to provide a differential output or a single terminal output depending upon the configuration of the charge pump. However, this fact is incidental to the aspects of the present invention as those skilled in the art would be knowledgeable of how to use the inputs as their design required.

While the preferred embodiment of the present invention has been described and illustrated, it will be apparent to persons skilled in the art that numerous modifications and variations are possible. Specifically, it should be obvious to persons skilled in the art that the invention could be adapted for use in combination with synthesisers, delay lock loops and any other circuit derived from a PLL topology.

Additionally, the insertion of additional MUXs in the loop to further isolate specific components would be obvious to persons skilled in the art after reviewing the present embodiment.

Alternatively, fewer MUXs may be inserted into the loop so that fewer components that make up a PLL (or a PLL-like circuit) can be isolated for the purpose of testing. For example, it would be obvious to one skilled in the art that only the MUX 32 is required to test the modified PFD 12'. Thus, the other MUXs present in FIG. 2 would not be required in an embodiment of the PLL 10' shown in FIG. 2 if only the modified PFD 12' had to be isolated for testing.

Lastly, it would be understood by those in the art that the constraints on testing a PLL that is not fully integrated are less severe and such a situation offers the designers more freedom to test individual components as required. However, the aspects of the present invention may be beneficially applied to PLL's that are not fully integrated but still within the scope of the present invention.

I claim:

1. A Phase-Locked Loop (PLL) integrated with testing apparatus comprising in a loop:
   i) a Phase-Frequency Detector (PFD), the PFD having first and second signal inputs, a test control input and an output, wherein the test control input is used to switch the PFD between a normal operating mode, in which the output delivers an output signal containing the phase and frequency difference between first and second signals applied respectively to the first and second signal inputs, and a transparent mode, in which only one of the first and second signal inputs is coupled to the output such that the corresponding signal is coupled through to the output unaltered;
   ii) a Voltage Controlled Oscillator (VCO), the VCO having an input and an output, the input of the VCO connected to the output of the PFD;
   iii) a frequency divider, the frequency divider having an input and an output, the input of the frequency divider connected to the output of the VCO; and
   iv) a first multiplexer (MUX), the first MUX having first and second signal inputs, a control input and an output, the output of the first MUX connected to the second signal input of the PFD, the first signal input of the first MUX connected to the output of the frequency divider, the second signal input coupled to receive a bias signal, and the control input coupled to receive a control signal;
   wherein the control signal coupled to the control input of the first MUX is set to select which one of the first and second signal inputs is coupled to the output of the first MUX.

2. The PLL of claim 1 further comprising a charge pump, the charge pump having an input and an output, the charge pump connected between the PFD and the VCO.

3. The PLL of claim 1 further comprising a loop filter connected to the input of the VCO.

4. The PLL of claim 1 further comprising a loop filter connected between the PFD and the VCO.

5. The PLL of claim 1 further comprising a third MUX having first and second signal inputs, a control input and an output, the output of the third MUX connected to the first input of the PFD, the first signal input of the third MUX coupled to receive a reference signal, the second signal input of the third MUX coupled to receive a second bias signal, and the control input of the third MUX coupled to receive a third control signal, wherein the third control signal coupled to the control input of the third MUX is set to select which one of the first and second signal inputs is coupled to the output of the third MUX.

6. The PLL of claim 5 further comprising a reference divider circuit, the reference divider having an input and an output, the input coupled to receive the reference signal and the output connected to the first signal input of the third MUX to provide a signal to the third MUX derived from the reference signal.

7. The PLL of claim 1 further comprising a second MUX between VCO and the frequency divider, the second MUX having first and second signal inputs, a control input and an output, the output of the second MUX connected to the input of the frequency divider, the first, signal input of the second MUX connected to the output of the VCO, the second signal input of the second MUX coupled to receive a first test signal, and the control input of the second MUX coupled to receive a second control signal, wherein the second control signal coupled to the control input of the second MUX is set to select which one of the first and second signal inputs is coupled to the output of the second MUX.

8. The PLL of claim 7 further comprising a mixer connected between the VCO and the second MUX, the mixer having two inputs and an output, the output of the mixer connected to the first signal input of the second MUX, the first input of the mixer coupled to receive the output of the VCO and the second input of the mixer coupled to receive a local reference signal.

9. The PLL of claim 8 further comprising a local oscillator, the local oscillator providing the local reference signal.

10. The PLL of claim 9 further comprising a fourth MUX between the local oscillator and the second input of the mixer, the fourth MUX having first and second signal input, a control input and an output, the first signal input of the fourth MUX coupled to receive the local reference signal, the second signal input of the fourth MUX coupled to receive a fourth bias signal, the output of the fourth MUX connected to the second input of the mixer, and the control input of the fourth MUX coupled to receive a fourth control signal, the fourth control signal set to select which of the two signal inputs is coupled to the output of the fourth MUX.

11. A Phase-Locked Loop (PLL) integrated with testing apparatus comprising in a loop:
   i) a Phase-Frequency Detector (PFD), the PFD having first and second signal inputs, a test control input and an output, wherein the test control input is used to switch the PFD between a normal operating mode, in which the output delivers an output signal containing the phase and frequency difference between first and second signals applied respectively to the first and second signal inputs, and a transparent node, in which only one of the first and second signal inputs is coupled to the output such that the corresponding signal is coupled through to the output unaltered;
   ii) a Voltage Controlled Oscillator (VCO), the VCO having an input and an output, the input of the VCO connected to the output of the PFD;
   iii) a frequency divider, the frequency divider having an input and an output, the output of the frequency divider connected to the; second signal input of the PFD; and
   iv) a first multiplexer (MUX), the first MUX having first and second signal inputs, a control input and an output, the output of the first MUX connected to the input of the frequency divider, the first signal input of the first MUX is connected to the output of the VCO, the second signal input of the first MUX coupled to receive a first test signal, and the control input of the first MUX coupled to receive a first control signal, wherein the first control signal coupled to the control input of the first MUX is set to select which one of the first and second signal inputs is coupled to the output of the first MUX.

12. The PLL of claim 11 further comprising a charge pump, the charge pump having an input and an output, the charge connected between the PFD and the VCO.

13. The PIL of claim 11 further comprising a loop filter connected to the input of the VCO.

14. The PLL of claim 11 further comprising a loop filter connected between the PFD and the VCO.

15. The PLL of claim 11 further comprising a third MUX having first and second signal inputs, a control input and an output, the output of the third MUX connected to the first input of the PFD, the first signal input of the third MUX is coupled to receive a reference signal, the second signal input of the third MUX coupled to receive a second bias signal, and the control input of the third MUX coupled to receive a third control signal, wherein the third control signal coupled to the control input of the third MUX is set to select which one of the first and second signal inputs is coupled to the output of the third MUX.

16. The PLL of claim 15 further comprising a reference divider circuit, the reference divider having an input and an output, the input coupled to receive the reference signal and the output connected to the first signal input of the third MUX to provide a signal to the third MUX derived from the reference signal.

* * * * *